(12) United States Patent
Painter

(10) Patent No.: US 11,721,462 B2
(45) Date of Patent: Aug. 8, 2023

(54) HIGH TEMPERATURE SUPERCONDUCTOR (HTS) CABLES AND METHOD OF MANUFACTURE

(71) Applicant: The Florida State University Research Foundation, Inc., Tallahassee, FL (US)

(72) Inventor: Thomas Andrew Painter, Tallahassee, FL (US)

(73) Assignee: The Florida State University Research Foundation, Inc., Tallahassee, FL (US)

( * ) Notice: Subject to any disclaimer, the term of this patent is extended or adjusted under 35 U.S.C. 154(b) by 950 days.

(21) Appl. No.: 16/480,455

(22) PCT Filed: Jan. 26, 2018

(86) PCT No.: PCT/US2018/015499
§ 371 (c)(1),
(2) Date: Jul. 24, 2019

(87) PCT Pub. No.: WO2018/203940
PCT Pub. Date: Nov. 8, 2018

(65) Prior Publication Data
US 2019/0385771 A1 Dec. 19, 2019

Related U.S. Application Data

(60) Provisional application No. 62/450,861, filed on Jan. 26, 2017.

(51) Int. Cl.
*H01F 6/06* (2006.01)
*H01F 41/061* (2016.01)
*H01F 41/04* (2006.01)
*H10N 60/01* (2023.01)

(52) U.S. Cl.
CPC ............. *H01F 6/06* (2013.01); *H01F 41/048* (2013.01); *H01F 41/061* (2016.01); *H10N 60/01* (2023.02)

(58) Field of Classification Search
CPC ........ H01F 6/06; H01F 41/061; H01F 41/048; H10N 60/01
See application file for complete search history.

(56) References Cited

U.S. PATENT DOCUMENTS

| 4,808,954 | A | 2/1989 | Ito |
| 4,883,922 | A | 11/1989 | Yokota et al. |
| 5,276,281 | A | 1/1994 | Sato et al. |
| 6,360,425 | B1 * | 3/2002 | Christopherson ..... H01L 39/248 505/231 |
| 9,916,927 | B1 | 3/2018 | Kandel et al. |

(Continued)

*Primary Examiner* — Paul A Wartalowicz
(74) *Attorney, Agent, or Firm* — Eversheds Sutherland (US) LLP

(57) ABSTRACT

A high temperature superconductor (HTS) cable comprising at least one coil form comprising a helical channel formed on an exterior surface of the coil form and the helical channel extending at least partially along an axial length of the coil form and a plurality of high temperature superconductor (HTS) tape layers positioned within the helical channel of the coil form. A method for operating a winding machine to produce a high temperature superconductor (HTS) cable comprising a plurality of coil forms comprising a helical channel formed on an exterior surface of the coil form.

18 Claims, 14 Drawing Sheets

(56) References Cited

U.S. PATENT DOCUMENTS

| | | | |
|---|---|---|---|
| 2007/0169957 A1* | 7/2007 | Ashibe | H01R 4/68 174/125.1 |
| 2009/0083967 A1 | 4/2009 | Meinke | |
| 2009/0107395 A1 | 4/2009 | Ha et al. | |
| 2009/0251257 A1 | 10/2009 | Stelzer et al. | |
| 2012/0115733 A1 | 5/2012 | Husband et al. | |
| 2018/0053587 A1 | 2/2018 | Weiss et al. | |
| 2019/0074119 A1 | 3/2019 | Hahn | |

\* cited by examiner

HIGH TEMPERATURE SUPERCONDUCTOR (HTS) CABLES AND METHOD OF MANUFACTURE

CROSS REFERENCE TO RELATED APPLICATIONS

This application claims priority to U.S. Provisional Patent Application 62/450,861, entitled, "Integrated Coil Form (ICF) Technology for High-Current Density Layer-Wound HTS Cables for High Field Solenoids", filed Jan. 26, 2017, the contents of which are herein incorporated by reference.

GOVERNMENT SUPPORT

This invention was made with Government support under Grant No. DMR-1157490 awarded by the National Science Foundation. The Government has certain rights in the invention.

BACKGROUND OF INVENTION

Cables fabricated from high temperature superconducting (HTS) wires are known in the art and are capable of transmitting up to 10 times more current than conventional cables. Alternatively, HTS cables are also capable of carrying an equivalent amount of current at much lower voltages. HTS cables can be used in both direct current (DC) and alternating current (AC) systems.

However, HTS cables currently known in the art are expensive to fabricate due to the cable-then-wind coil process employed in the manufacturing of the cables. The HTS cabling process itself is expensive and the known HTS cables themselves have been shown to degrade when wound into a coil. Additionally, the present known HTS cables all incur $I_c$ degradation during the winding process and bend diameters are limited. In addition, all the present known HTS cables are twisted/transposed for AC performance.

HTS single tapes are known in the art which exhibit a high inductance, increased charging times, increased quench voltage, increased NI coil field delay and increased difficulty of flux pumping. In addition, engineering coatings of the HTS single tape coils are limited by superconductor processing limits.

Accordingly, what is needed in the art is an improved high temperature superconductor (HTS) cable that overcomes the deficiencies known in the art.

SUMMARY OF INVENTION

In various embodiments, the present invention provides an integrated coil form (ICF) technology for the fabrication of a high-current density, layer-wound HTS cable that may be employed in high field solenoids.

In one embodiment, the present invention provides a high temperature superconductor (HTS) cable including, at least one coil form comprising a helical channel formed on an exterior surface of the coil form and the helical channel extending at least partially along an axial length of the coil form and a plurality of high temperature superconductor (HTS) tape layers positioned within the helical channel of the coil form. In a particular embodiment, the HTS tape is a rare earth barium copper oxide (REBCO) HTS tape.

In an additional embodiment, the HTS cable may include a plurality of coil forms, wherein each of the coil forms are positioned in concentric overlapping relation to each other.

The present invention additionally provides a method for operating a winding machine to produce a high temperature superconductor (HTS) cable. In one embodiment, the method includes, positioning a coil form onto a rotatable spool of a winding machine, the coil form comprising a helical channel formed on an exterior surface of the coil form and the helical channel extending at least partially along an axial length of the coil form. The method further includes, positioning a plurality of payoff spools onto the winding machine, wherein at least one of the plurality of payoff spools is wound with a high temperature conductor (HTS) tape, and rotating the rotatable spool to position a plurality of HTS tape layers within the helical channel of the coil form.

In a particular embodiment for fabricating an HTS cable having multiple coil forms, after rotating the rotatable spool to position a plurality of HTS tape layers within the helical channel of a first coil form, the method may further include, positioning a second coil form onto the rotatable spool of the winding machine and in concentric relation to the first coil form, rotating the rotatable spool to position the plurality of HTS tape layers within the helical channel of the second coil form and positioning the HTS tape layers of the second coil form coincident with the HTS tape layers of the first coil form.

Accordingly, the present invention provides an improved HTS cable comprising one or more coil forms and an associated method of manufacturing the HTS cable utilizing the coil forms.

BRIEF DESCRIPTION OF THE DRAWINGS

For a fuller understanding of the invention, reference should be made to the following detailed description, taken in connection with the accompanying drawings, in which.

DETAILED DESCRIPTION OF THE PREFERRED EMBODIMENT

It will be seen that the advantages set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

In various embodiment, the present invention provides a high temperature superconductor (HTS) cable which includes at least one coil form comprising a helical channel formed on an exterior surface of the coil form and a plurality of high temperature superconductor (HTS) tape layers positioned within the helical channel of the coil form.

Figure 1:
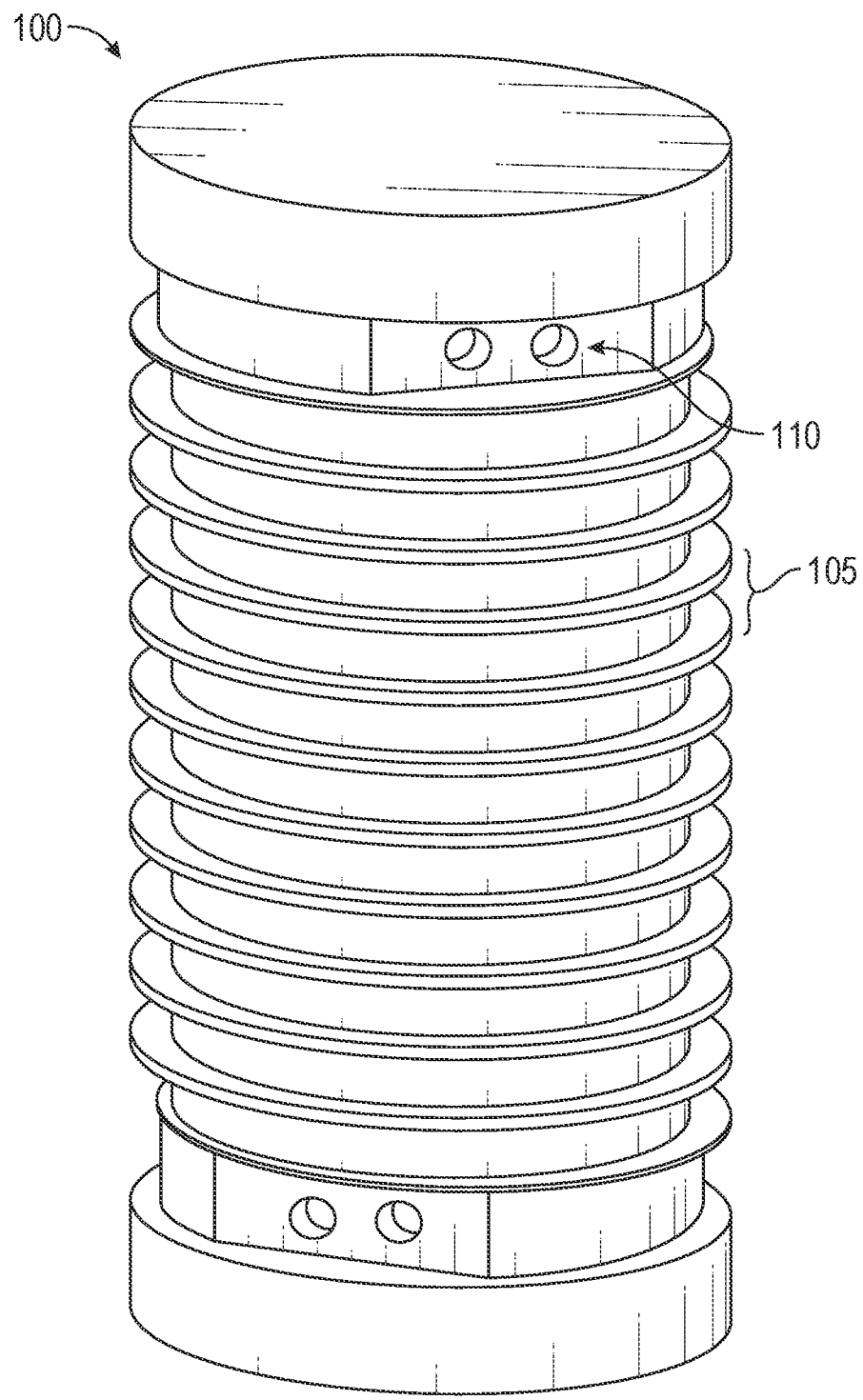
FIG. 1 is an illustration of an exemplary coil form, in accordance with an embodiment of the present invention.

There are many reasons for preferring an HTS cable over a single HTS tape. The reasons include:
- Large inductance differences.
- NI coil charging delay time constant, $\tau = L/R$
- Comparing a tape-wound and a cable-wound coil. Assuming same current density and coil cross-section, stored energy is same. $(LI^2)_{tape} = (LI^2)_{cable}$
  $E_{tape} = E_{cable} = 0.5(LI^2)_{tape} = 0.5(LI^2)_{cable}$
  $L_{tape}/L_{cable} = (I_{cable}/I_{tape})^2 = (20,000/200)^2 = 10^4$
  Or as a lower limit $(5,000/500)^2 = 10^2$
  $L_{tape}$ = somewhere between $10^2$ $L_{cable}$ and $10^4$ $L_{cable}$
  $\tau_{cable} = 0.001$ to $0.0001$ $\tau_{tape} = 1\%$ to $0.01\%$ $\tau_{tape}$
- Large potential for reducing charging delays or in addition decreasing bypass resistance to add stability or in addition reducing cryogenic heat load during charging of the magnet system An exemplary coil form 100 is illustrated in FIG. 1. As shown in FIG. 1, the coil form 100 includes a helical channel 105 formed on an exterior surface of the coil form 100 and the helical channel 105 extending at least partially along an axial length of the coil form 100.

The coil form 100 may additionally include a mechanism for maintaining an insulative gap between concentric coil forms 100 when the HTS cable comprises two or more coil forms 100. In this embodiment, the mechanism for maintaining the insulative gap between concentric coil forms 100 is a recessed portion 105 including apertures for accepting one or more set screws. The set screws may be adjusted to maintain the insulative gap between the concentric coil forms 100. Other means for maintaining the required spacing are within the scope of the present invention.

As shown, in this embodiment the coil form 100 is substantially cylindrical. The cylindrical coil form 105 may be machined to form the helical channel 105. The coil form may be fabricated of various materials, including, but not limited to stainless steel, copper and combinations thereof.

In a particular embodiment, a depth of helical channel 105 of the coil form 100 may vary along the axial length of the coil form 100. In a specific embodiment, a tapered helix may be established in the helical channel 105 wherein the depth of the helical channel 105 in the coil form 100 is reduced as it approaches the end of the coil form 100. As such, the depth of the helical channel 105 becomes shallower as it approaches the end of the coil form 100. The tapered helix shape of the helical channel 105 minimizes joint resistance, resulting in the absence of substrate in the current path.

Figure 2A:
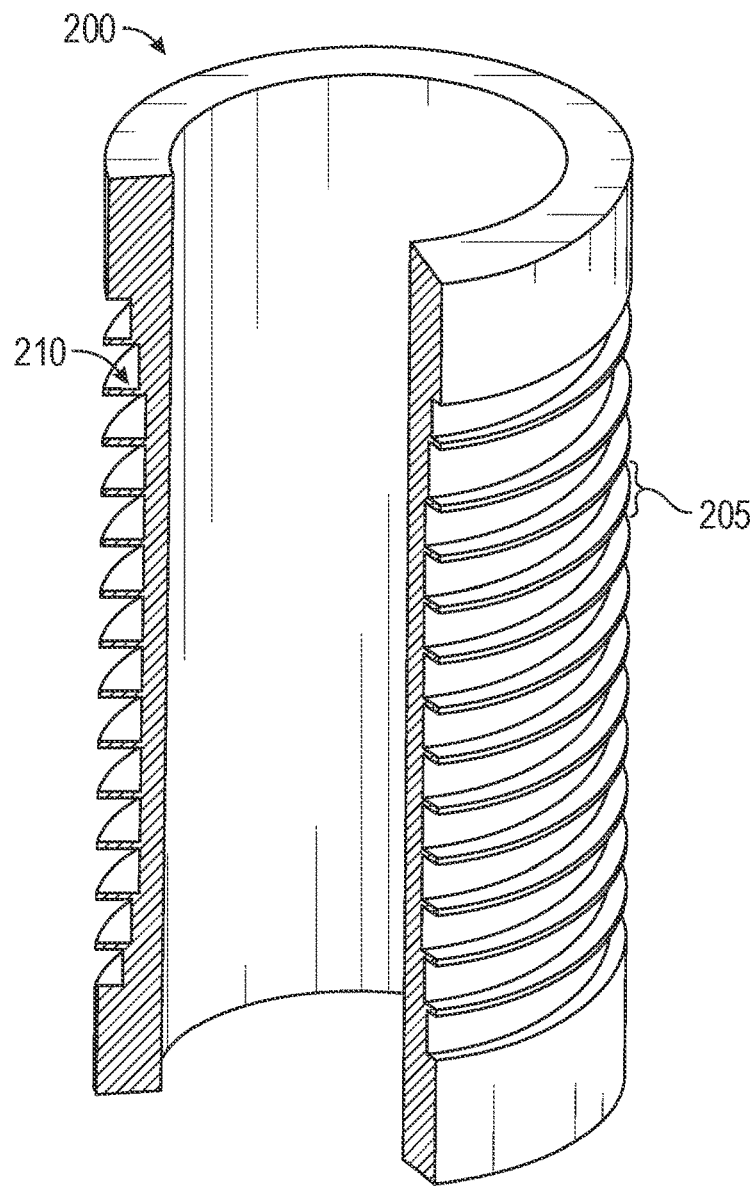
FIG. 2A is an illustration of an exemplary coil form having integrated joints, in accordance with an embodiment of the present invention.
Figure 2B:
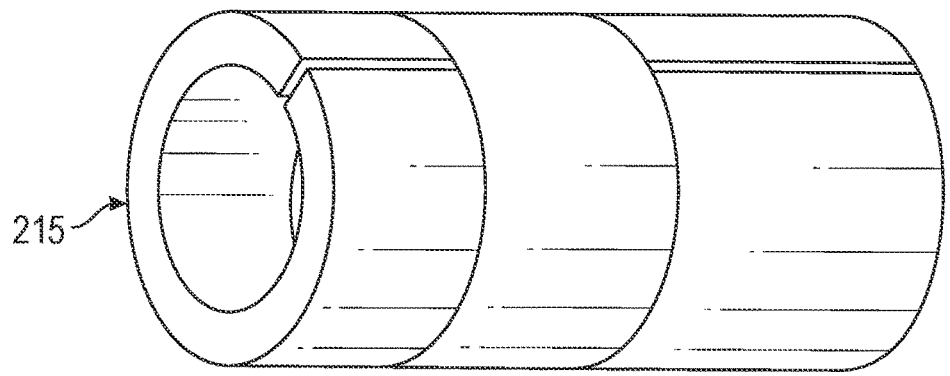
FIG. 2B is an illustration of an integrated joint to be brazened to the coil form, in accordance with an embodiment of the present invention.

FIG. 2A illustrates and additional embodiment of a coil form 200 of the present invention which includes a helical channel 205 and one or more joints 210. In this embodiment, the joints 210 may be brazed into the coil form 200 prior to machining the helical channel 205, thereby creating helical channel path-integrated joints. An exemplary brazement joint 210 is illustrated in FIG. 2B.

An HTS cable in accordance with the present invention is formed using a layer wound cable technique, wherein one or a plurality of HTS tapes at a time are wound onto the coil form 100, thereby reducing strain. The machined helical channel 105 of the coil form 100 makes it easier to wind the HTS tape around the coil form 100 because the helical channel 105 allows precise positioning of the HTS tape during winding. The helical channel 105 also eliminates accumulated axial strain at terminal transition points (wherein magnets are known to fail) from accumulated thermal and magnetic loads during cooldown and operation. The helical channel 105 also exhibits a reduced risk design, engineering is greatly simplified and transition is mechanically robust. The machines helical channel 105 also eliminates accumulated axial stress at the coil midplane and reduces contributed Poisson strain in hoop direction, which is one of the limiting stress design factors for high-field magnets. The use of a helical channel 105 also eliminates separate, expensive, cabling processes because the cabling is performed directed on the coil form 100.

Figure 3:
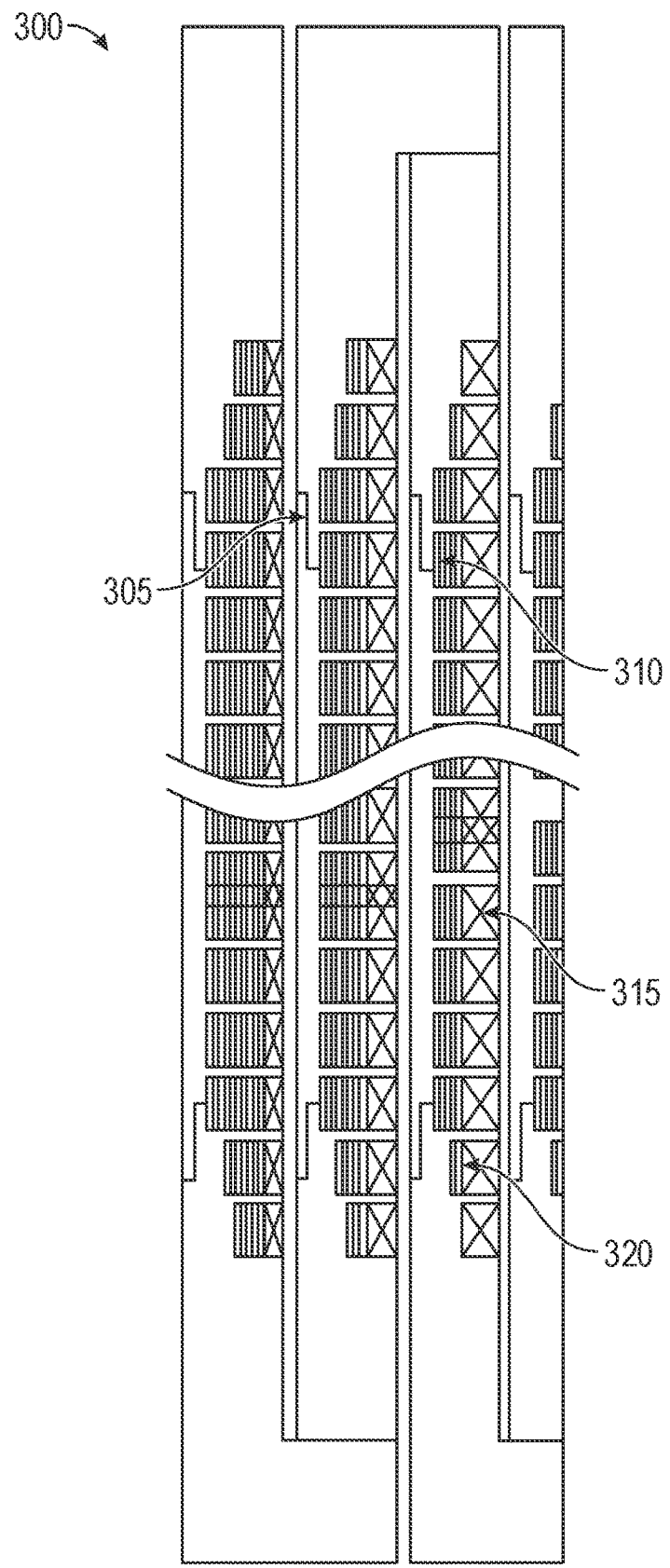
FIG. 3 is a cross-sectional view of an exemplary coil form, in accordance with an embodiment of the present invention.

FIG. 3 illustrates a cross-sectional view of an HTS cable 300, in accordance with the present invention, formed from a four-layer coil form wound with multiple layers of HTS tape 310. In one embodiment, the HTS tape is a rare earth barium copper oxide (REBCO) HTS tape.

The joints 305 are formed on the coil form prior to machining the helical channel. The multiple HTS tape layers 310 of the HTS cable 300 are formed by winding one or a plurality of HTS tapes at a time onto the coil form 100, thereby reducing strain. In addition, no $I_c$ degradation is expected in this design for cable-during-wind. Reinforcement strips 315 may be applied in strips over turns of the HTS tape layers 310. As previously described, the helical channel may be in the form of a tapered helix 320, wherein the depth of the helical channel is reduced towards the ends of the coil form. In one embodiment, the stack of HTS tapes ends at the end of the coil, resulting from the multiple windings, are "feathered" onto the coil form by cutting each tape slightly longer then the tape underneath it.

The use of a machined helical channel in the coil forms used to form the HTS cable 300 allows for modular layer joints 305 that are easy to remove and/or remediate and allows the use of relatively short piece lengths of HTS tape. The layer joints are located in less valuable coil end space, in comparison to midplane joints commonly required in pancake style windings.

The helical channel in the coil forms of the present invention also provides for optimized, graded layers. The HTS cable cross-section can be reduced as the magnetic field decreases, radially, and the layer is only limited by the local magnetic field. In addition, reinforcement thickness can be adjusted, wherein each layer is optimized to both $I_c$ and strain limits. The layers can also be optimized to different heights.

The helical channels also allow for precision winding and provides a platform for controlled turn-to-turn resistance, which can be engineered to meet NI (non-insulated) charging and stability requirements.

Figures 4A, 4B, 4C:
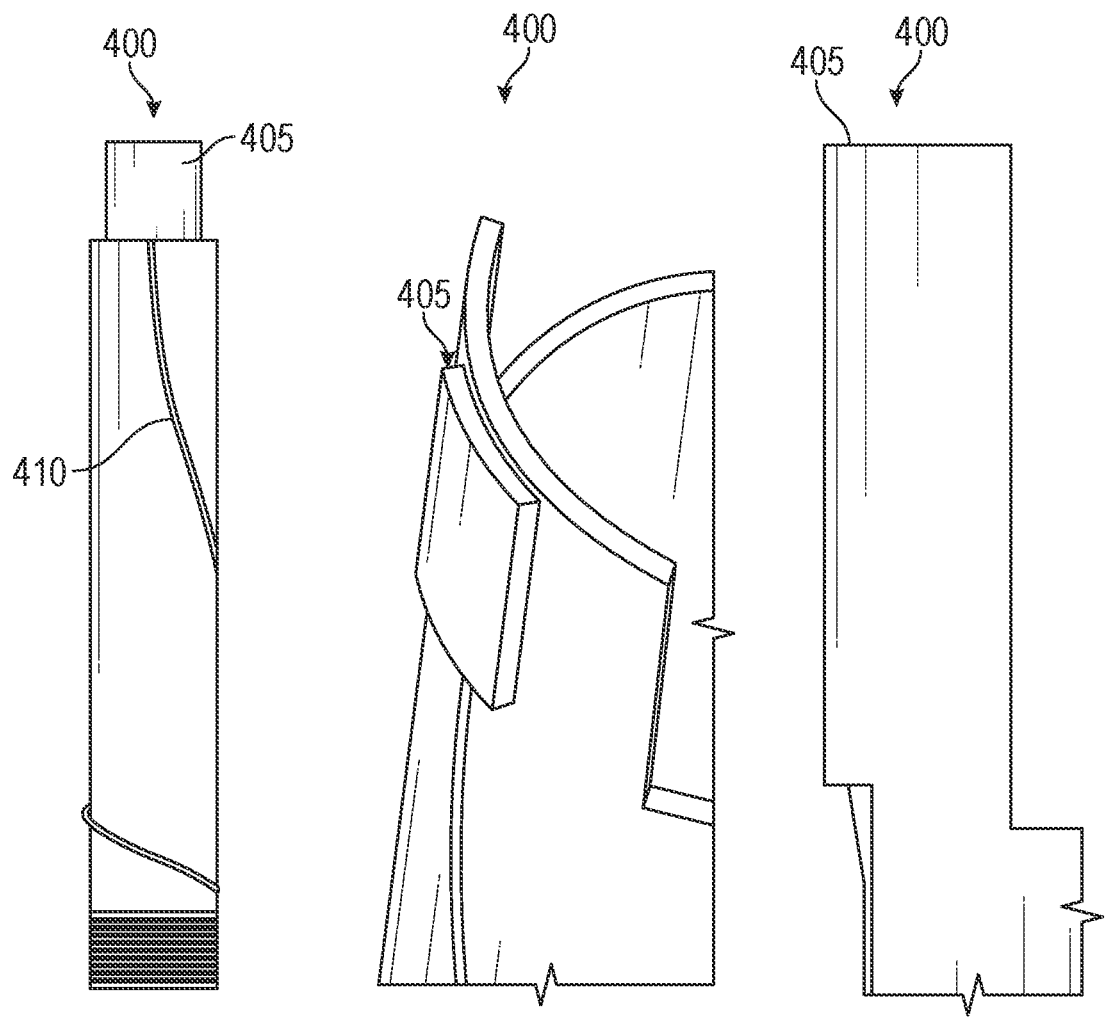
FIG. 4A is an illustration of the coil form and the lead termination, in accordance with an embodiment of the present invention.
FIG. 4B is an expanded front-view illustration of the coil form lead termination, in accordance with an embodiment of the present invention.
FIG. 4C is an expanded side-view illustration of the coil form lead termination, in accordance with an embodiment of the present invention.
Figure 5:
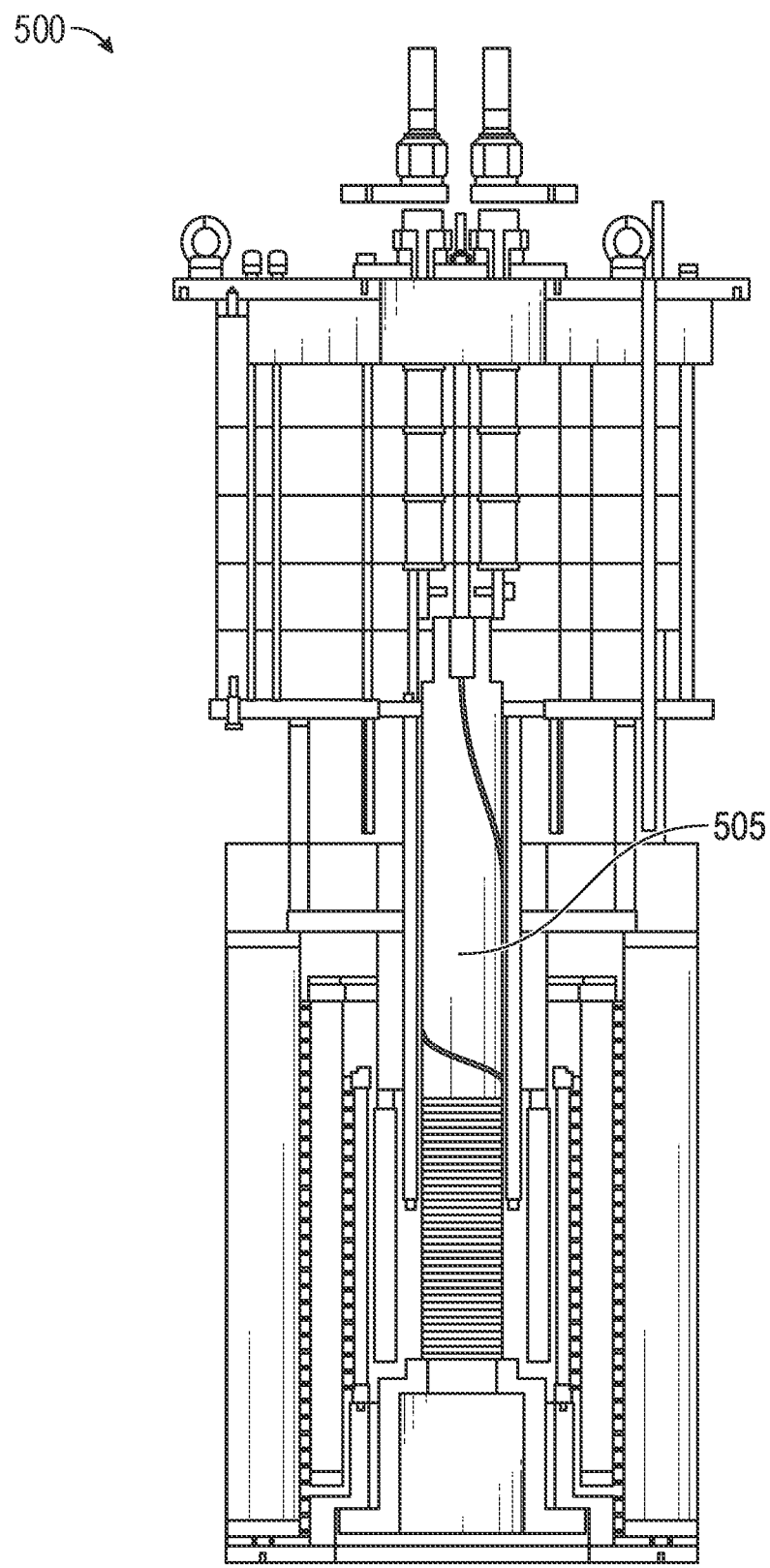
FIG. 5 is an illustration of the coil form lead termination for a coil form incorporated into a 14 T Background Magnet, in accordance with an embodiment of the present invention.

As shown in FIG. 4A-FIG. 4C, the coil form 400 of the present invention may further include a lead termination 405 positioned at an end of one of the HTS tape layers 410. FIG. 5 further illustrates the lead termination for a coil form 505 incorporated into a 14 T Background Magnet system 500.

In various embodiments, the HTS cable of the present invention includes a plurality of coil forms, wherein each of the coil forms are positioned in concentric overlapping relation to each other. In this embodiment, a plurality of coil forms, each of the plurality of coil forms comprising a helical channel formed on an exterior surface of the coil form and the helical channel extending at least partially along an axial length of the coil form and a plurality of high temperature superconductor (HTS) tape layers positioned within the helical channel of the coil form, are positioned in concentric overlapping relation to each other and separated from each other by an insulative gap.

Figure 6A:
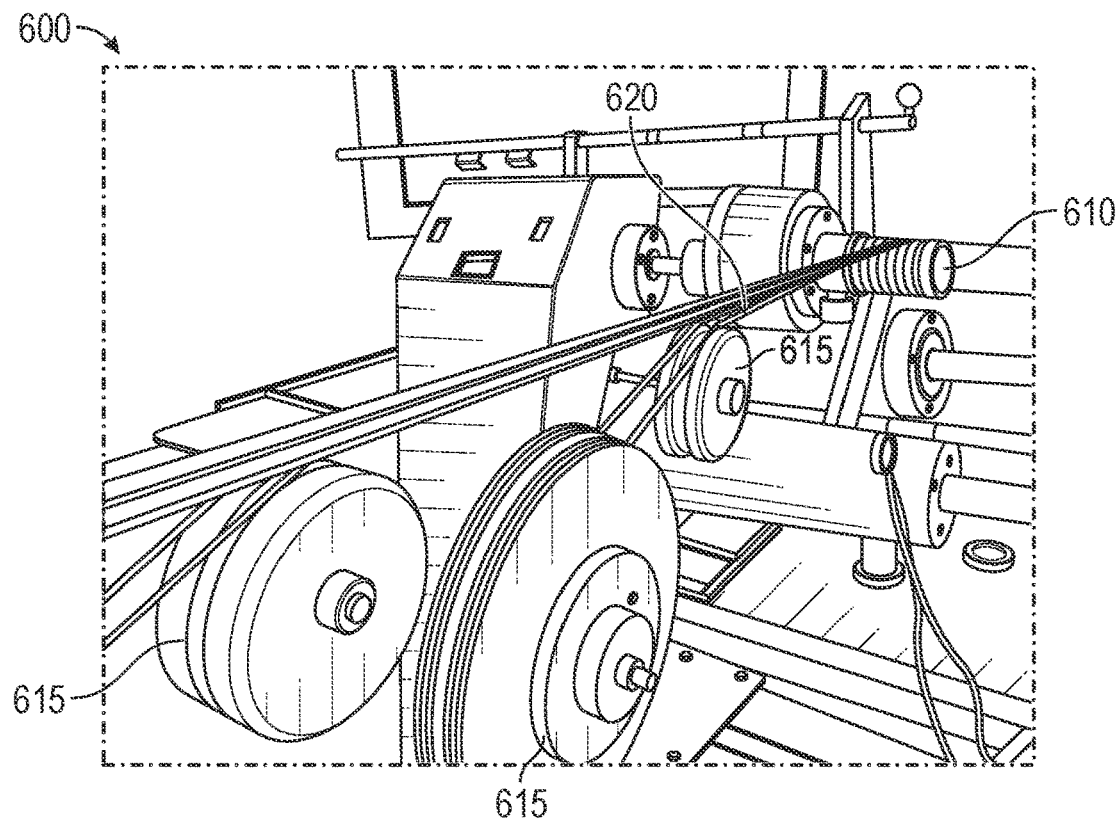
FIG. 6A is an illustration of a multi-tape payoff winding system for producing an HTS coil form cable, in accordance with an embodiment of the present invention.
Figure 6B:
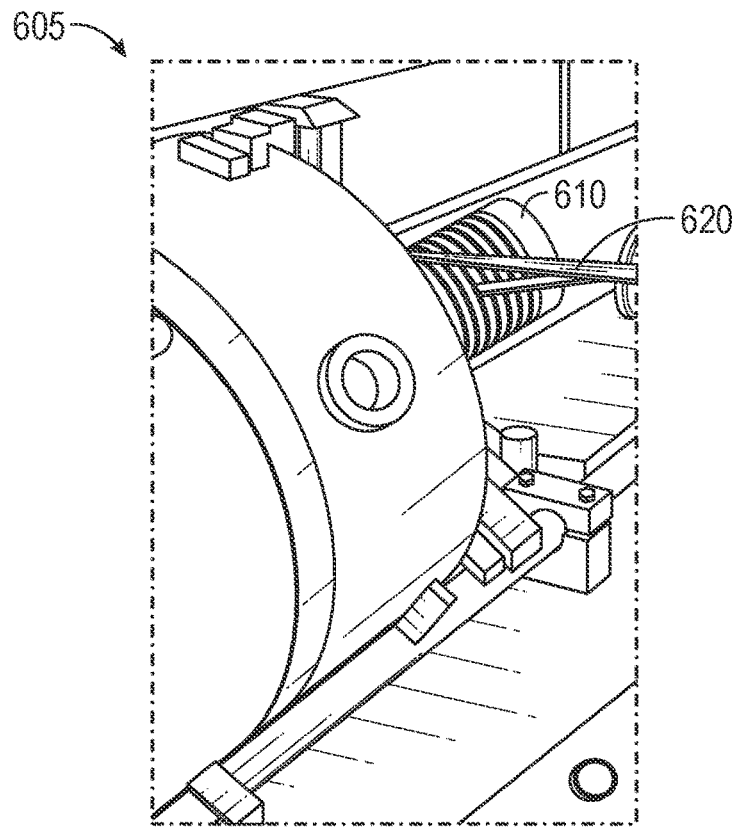
FIG. 6B is an exploded illustration of the coil form in a multi-tape payoff winding system for producing an HTS coil form cable, in accordance with an embodiment of the present invention.

With reference to FIG. 6A and FIG. 6B, a winding machine for producing the high temperature superconductor (HTS) cable of the present invention is illustrated. As shown in FIG. 6A, the winding machine 600 includes a plurality of payoff spools 615. The HTS tapes 620 are wound onto separate payoff spools 615. The tapes are then threaded through the multi-tape payoff machine 600, which is designed for constant tap tension. The coil form 610 is then rotated to pull the HTS tapes 620 from the tensioned payoff directly onto the coil form 610. FIG. 6B shows an expanded view 605 of the coil form 610 and the HTS tapes 620.

In an exemplary embodiment, an HTS test cable according to the following specifications can be produced using the winding machine described above:

TABLE 1

Design Values.

| Total Field = | 16.5 | T |
|---|---|---|
| Insert Field = | 2.50 | T |
| Background Field = | 14/14 T Cryogenic | |
| Iop/Ic | 0.7 | |
| max hoop strain (not including winding strain) = | 0.56 | % |
| Inner Radius = | 45.0 | mm |
| turns/layer for inner layer | 40.0 | |
| taper angle = | 45.0 | deg |
| number of coils = | 2 | |
| estimated conductor length = | 0.212 | km |
| Outer Radius = | 52.3 | mm |
| Cable Current = | 5.62 | kA |
| Inductance = | 2.44E−04 | H |
| Stored Energy = | 3.85E−03 | MJ |
| winding pack weight, nominal = | 3.2 | kg |
| field delay time constant = | <0.11? | s |
| number of tapes in cable = | 8.29 | tapes |
| copper current density max = (requires additional 0.33 mm pure copper tape) | 2067 | A/mm$^2$ |
| coil 1 winding pack $J_c$ = | 267 | A/mm$^2$ |
| coil 2 winding pack $J_c$ = | 351 | A/mm$^2$ |
| average winding pack $J_c$ = | 303 | A/mm$^2$ |
| design number = | 8/22/2017 17:26 | |

Figure 7:
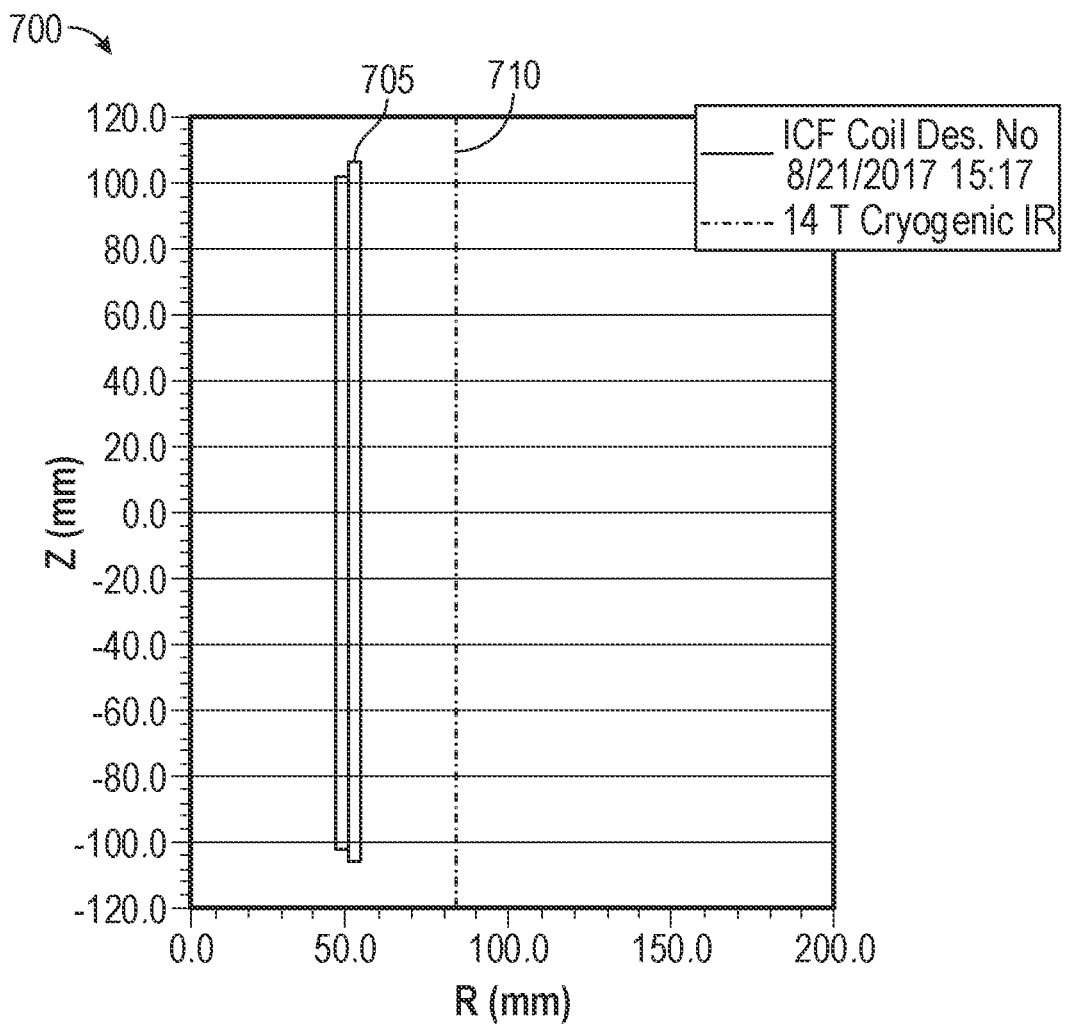
FIG. 7 is a graphical illustration of the results of a test of the coil form embodiment illustrated in FIG. 5.
Figure 8:
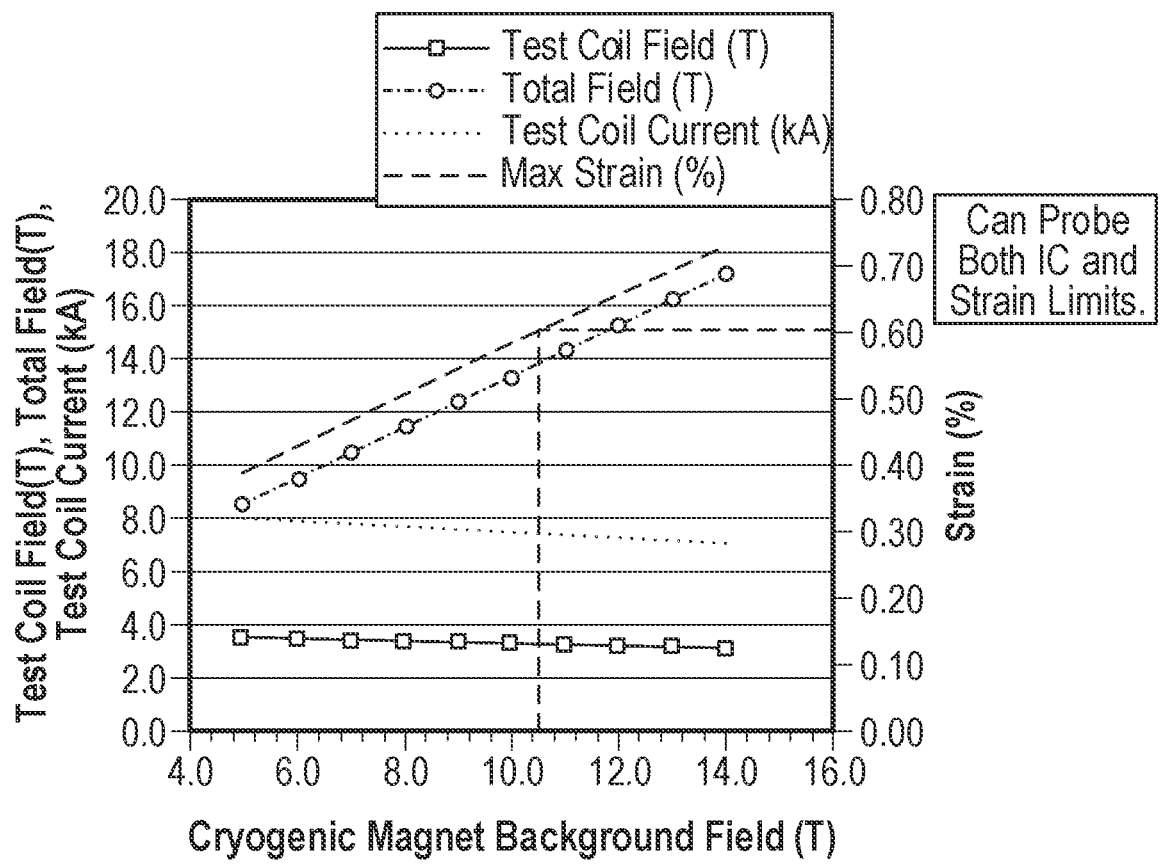
FIG. 8 is a graphical illustration of the strain relative to the cryogenic magnet background field of the coil form embodiment illustrated in FIG. 5, at the critical current.
Figure 9:
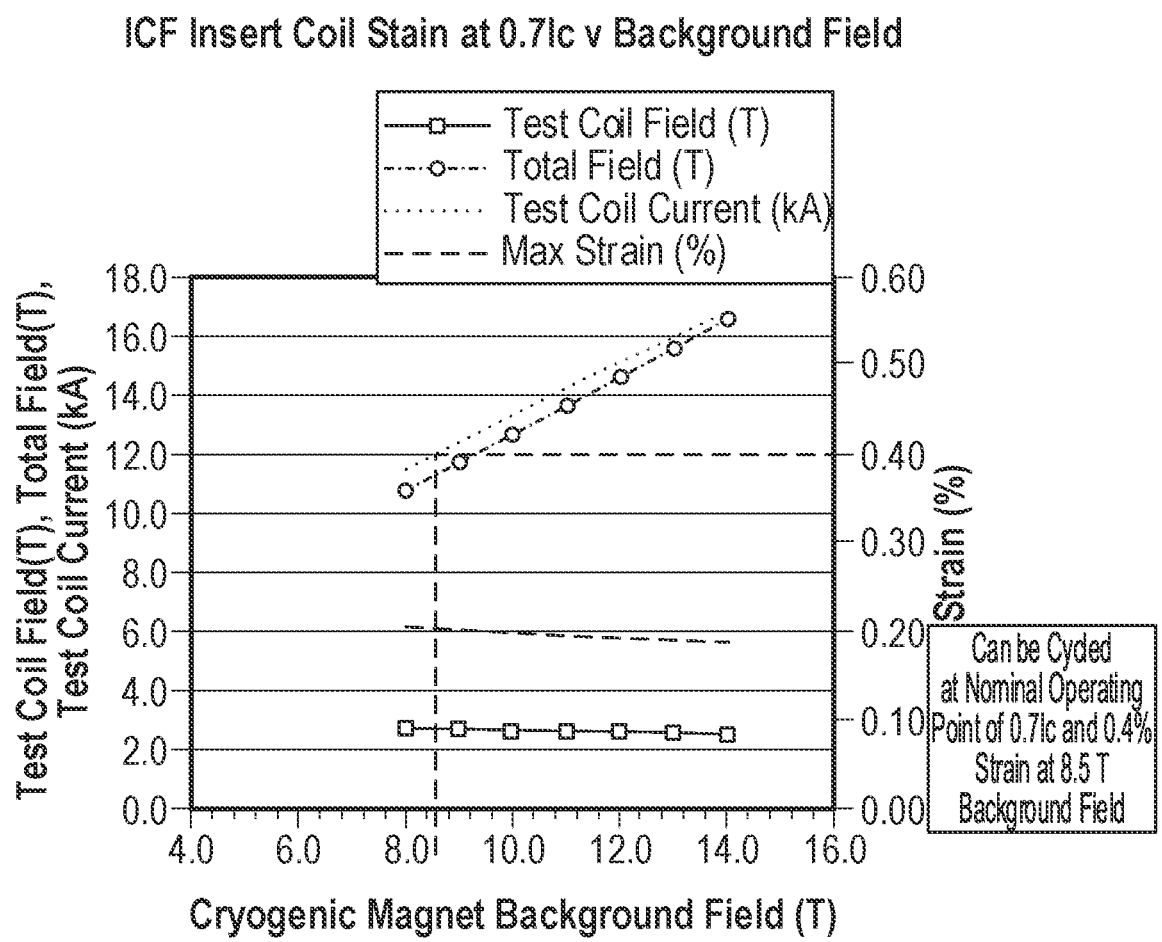
FIG. 9 is a graphical illustration of the strain relative to the cryogenic magnet background field of the coil form embodiment illustrated in FIG. 5, at 0.7 of the critical current.

FIG. 7 is a graphical illustration of the results of the HTS test coil design in a 14 T background field. FIG. 8 is a graphical illustration of the results of probing both $I_c$ and strain limits of the HTS test coil in a 14 T background field. As such, capabilities are shown for probing sharpness of critical limit transitions in an HTS cable for the first time, which is important for quench detection and cable "n-value" heating. FIG. 9 is a graphical illustration of measuring degradation with cycling of the HTS test coil in a 14 T background field. As shown, it is possible to cycle the test coil at nominal operating margins (0.7 I/$I_c$ and 0.4% strain) to measure degradation with cycling. Additionally, cycling at more aggressive 0.5% strain can also be achieved.

In an additional embodiment, a method for producing an HTS cable includes, positioning a coil form onto a rotatable spool of a winding machine, the coil form comprising a helical channel formed on an exterior surface of the coil form and the helical channel extending at least partially along an axial length of the coil form. The method further includes, positioning a plurality of payoff spools onto the winding machine, wherein at least one of the plurality of payoff spools is wound with a high temperature conductor (HTS) tape and rotating the rotatable spool to position a plurality of HTS tape layers within the helical channel of the coil form.

As shown with reference to FIG. 10A-FIG. 10I, an HTS cable can be formed by more than one concentric coil forms wound with HTS tape.

Figure 10A:
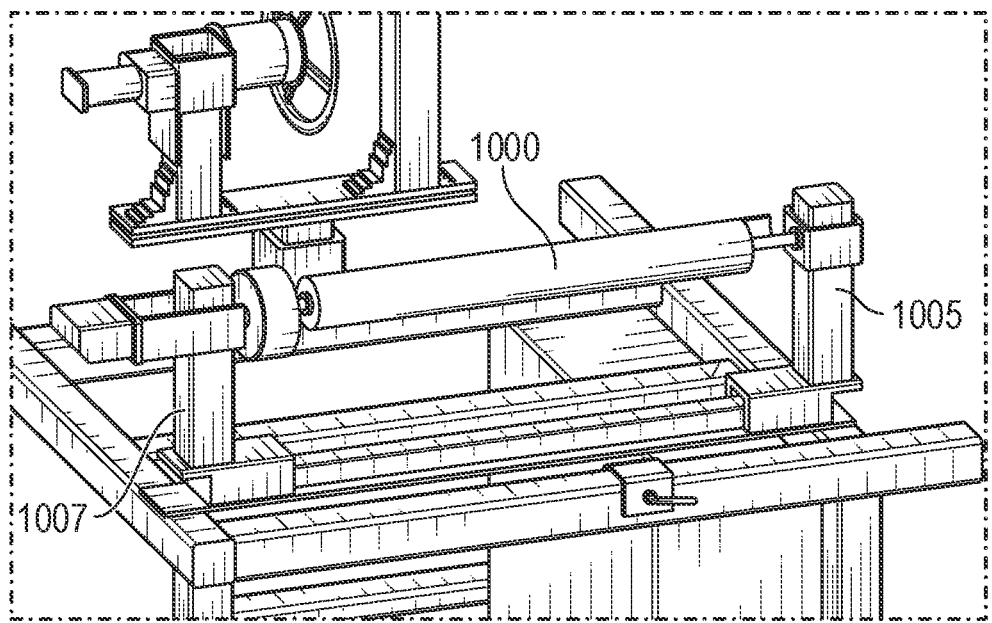
FIG. 10A-FIG. 10I illustrate exemplary process steps for producing the HTS coil form cable of the present invention.
Figure 10B:
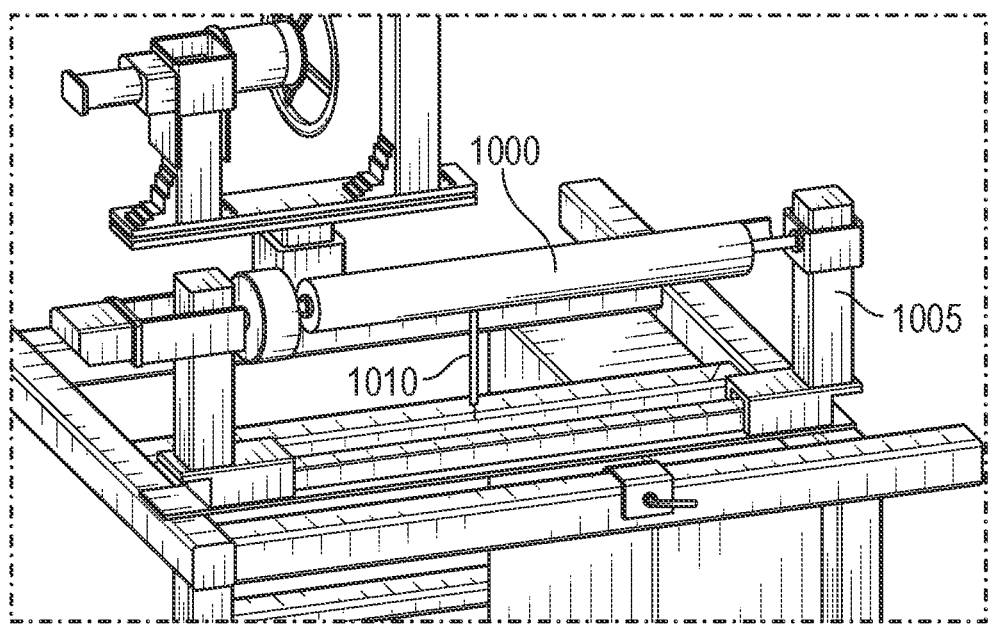
Figure 10C:
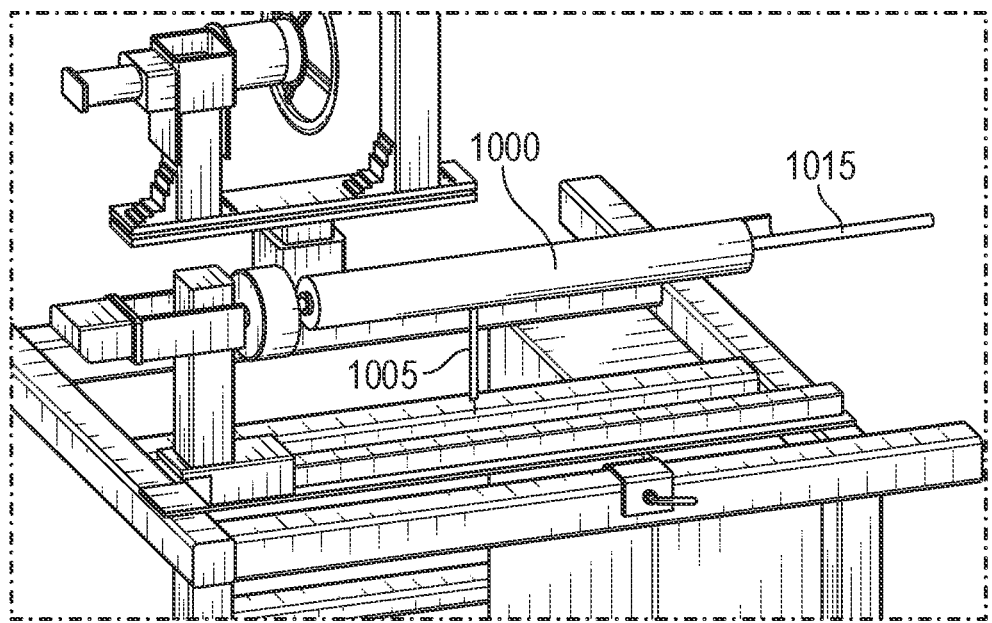
Figure 10D:
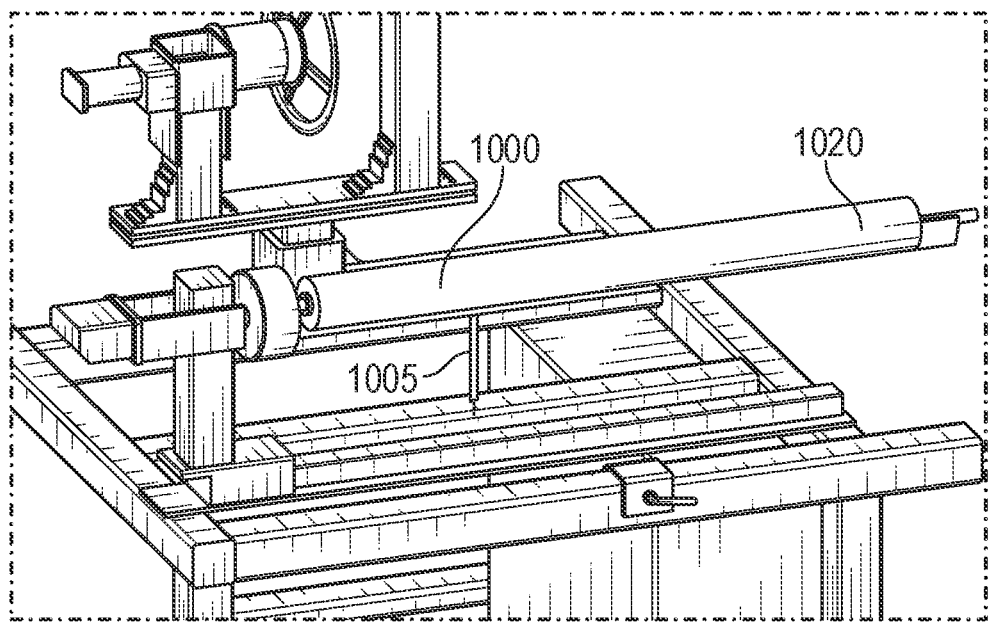
Figure 10E:
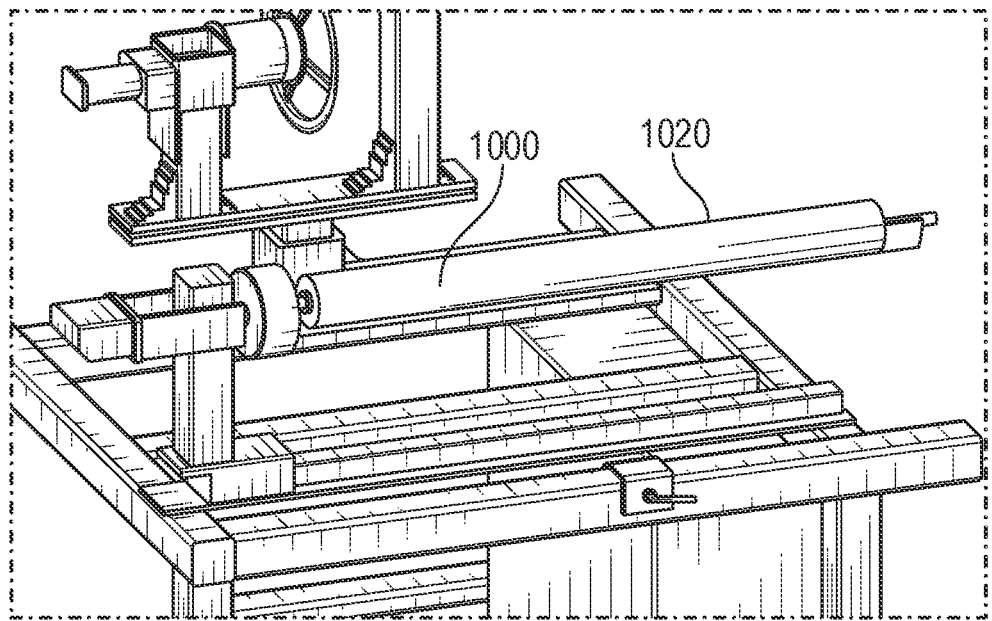
Figure 10F:
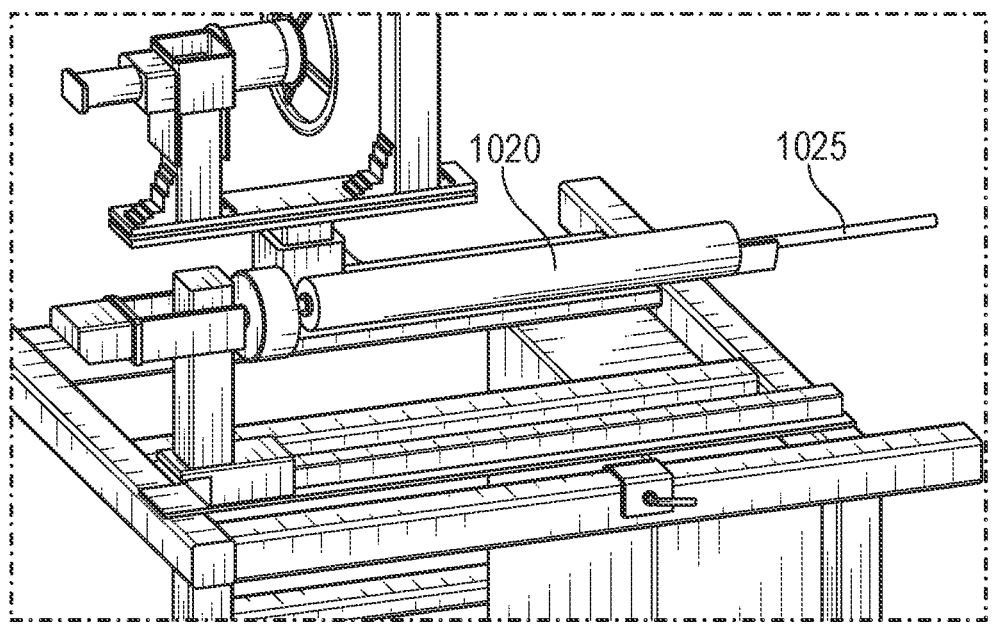
Figure 10G:
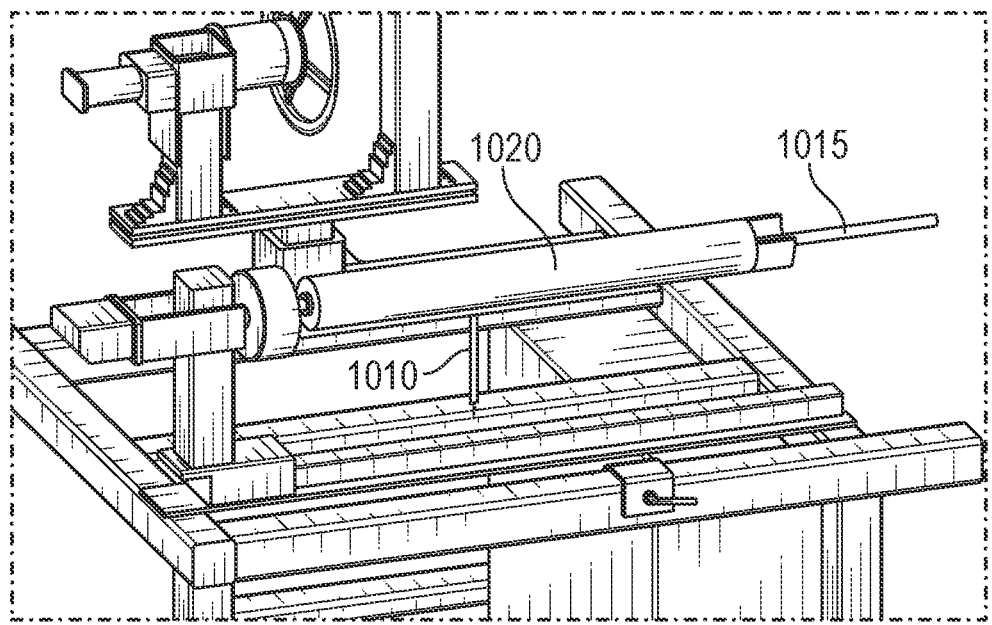
Figure 10H:
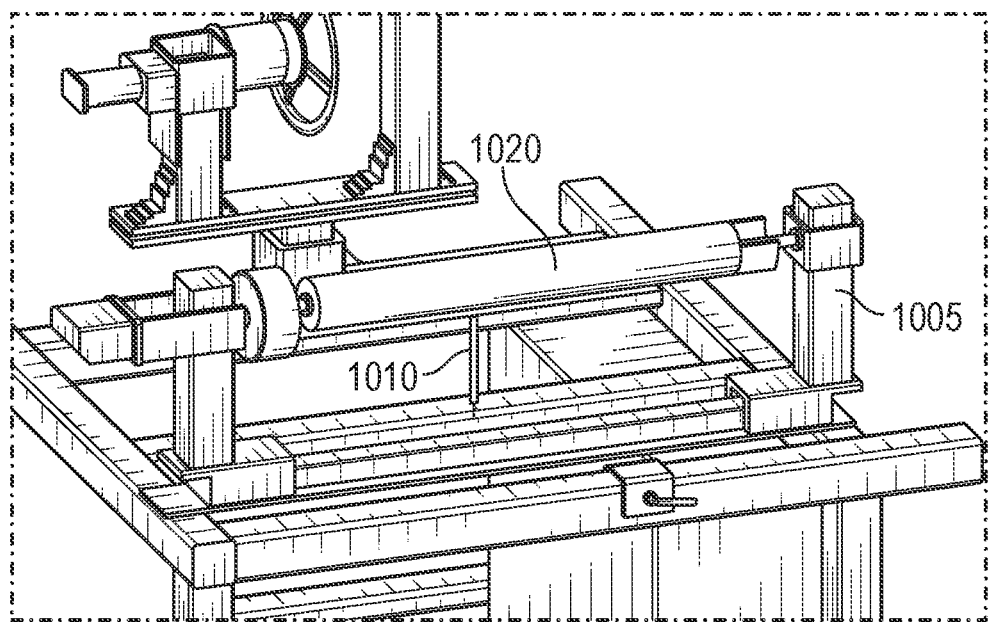
Figure 10I:
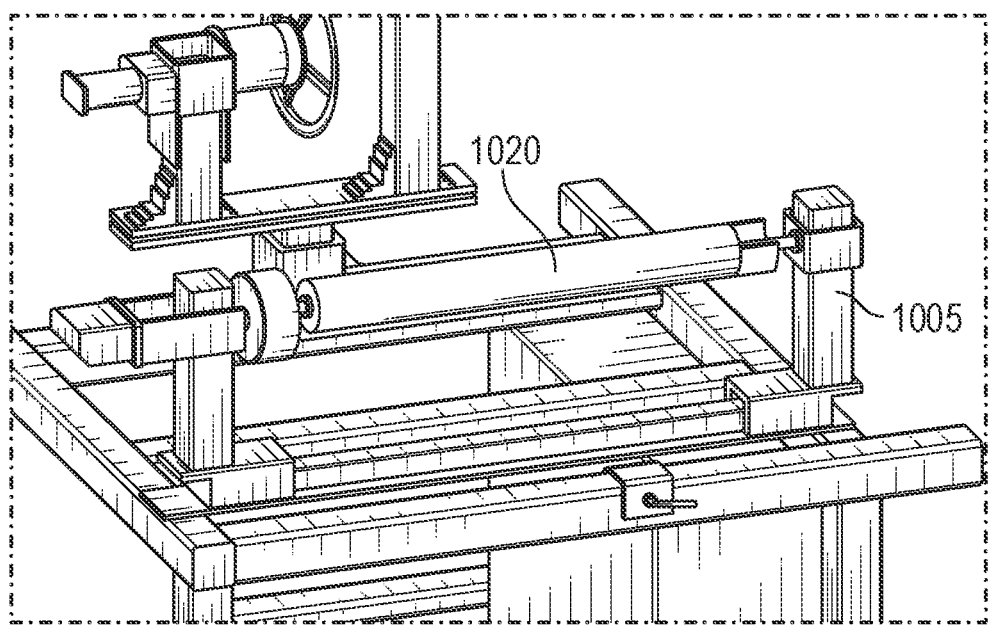

As shown in FIG. 10A, a first coil form 1000 is positioned on a rotatable spool of a winding machine and supported by a first tail stock 1007 and a second tail stock 1005. Following the winding of the first coil form 1000, at FIG. 10B, a temporary support 1010 is positioned under the first coil form 1000. At FIG. 10C, the first tail stock 1005 is removed and an extension 1015 is added to the rotatable spool of the winding machine. At FIG. 10D, a second coil form 1020 is positioned in concentric relation to the first coil form 1000. At FIG. 10E, the temporary support 1010 is removed and at FIG. 10F, the second coil form 1020 is positioned such that the helical coil of the first coil form 1000 overlaps the helical coil of the second coil form 1020. At FIG. 10G, the temporary support 1010 is replaced and at FIG. 10H, the first tail stock 1005 is replaced. At FIG. 10I, the temporary support 1010 is then removed for the winding of the second coil form 1020.

As such, the ICF technology or ICF-enabled technology of the present invention provide for cable fabrication that is integrated into coil winding, thereby eliminating the cabling process and associated cost by eliminating the extra cabling cost. The ICF technology provides for zero degradation from cabling and winding diameters as low as 14 mm. In addition, inductance (for equal magnets) is reduced by $(I_{cable}/I_{tape})^2$. A lower inductance suggests flux pumps can eliminate expensive current leads and major power supply infrastructure.

The ICF technology of the present invention provides greater potential for closed circuit refrigeration since all joints are located on winding pack ends, thereby improving safety and requiring less infrastructure. In addition, ICF turn spacers are not subject to superconductor processing limits and are better suited for engineering stability coatings, when necessary.

It is also to be understood that the following claims are intended to cover all of the generic and specific features of the invention herein described, and all statements of the scope of the invention which, as a matter of language, might be said to fall therebetween, Now that the invention has been described,

What is claimed is:

1. A high temperature superconductor (HTS) cable comprising:
   at least one coil form comprising a helical channel formed on an exterior surface of the coil form and the helical channel extending at least partially along an axial length of the coil form; and one or more high temperature superconductor (HTS) tapes wound within the helical channel of the coil form so that a plurality of HTS tape layers is present within the helical channel, wherein the plurality of HTS tape layers comprise a first HTS tape layer wound within the helical channel of the coil form and one or more additional HTS tape layers wound within the helical channel of the coil form, each of the one or more additional HTS tape layers positioned on top of an HTS tape layer already present within the helical channel to form a stack of HTS tape layers.

2. The HTS cable of claim 1, wherein a depth of the helical channel of the coil form varies along the axial length of the coil form.

3. The HTS cable of claim 1, wherein a depth of the helical channel of the coil form is reduced as the helical channel approaches an end portion of the coil form.

4. The HTS cable of claim 1, wherein each of the one or more HTS tapes is a rare earth barium copper oxide (REBCO) HTS tape.

5. The HTS cable of claim 1, wherein the coil form is substantially cylindrical.

6. The HTS cable of claim 1, wherein the coil form is made of one or more of stainless steel and copper.

7. The HTS cable of claim 1, further comprising one or more integrated terminals fabricated onto the coil form.

8. The HTS cable of claim 1, further comprising a lead termination positioned at an end of one of the HTS tape layers.

9. The HTS cable of claim 1, further comprising a plurality of coil forms, wherein each of the coil forms are positioned in concentric overlapping relation to each other.

10. A high temperature superconductor (HTS) cable comprising:
a plurality of coil forms, wherein each of the plurality of coil forms comprises a helical channel formed on an exterior surface of the coil form, the helical channel extending at least partially along an axial length of the coil form; and one or more high temperature superconductor (HTS) tapes wound within the helical channel of the coil form so that a plurality of HTS tape layers is present within the helical channel, wherein the plurality of HTS tape layers comprise a first HTS tape layer wound within the helical channel of the coil form and one or more additional HTS tape layers wound within the helical channel of the coil form, each of the one or more additional HTS tape layers positioned on top of an HTS tape layer already present within the helical channel to form a stack of HTS tape layers, and wherein each of the plurality of coil forms is positioned in concentric overlapping relation to each other and separated from each other by an insulative gap.

11. A method for operating a winding machine to produce a high temperature superconductor (HTS) cable, the method comprising:
positioning a coil form onto a rotatable spool of a winding machine, the coil form comprising a helical channel formed on an exterior surface of the coil form and the helical channel extending at least partially along an axial length of the coil form;

positioning a plurality of payoff spools onto the winding machine, wherein at least one of the plurality of payoff spools is wound with a high temperature superconductor (HTS) tape; and rotating the rotatable spool to position a stack of HTS tape layers within the helical channel of the coil form, wherein rotating the rotatable spool is effective to wind a first HTS tape layer within the helical channel of the coil form and then to wind one or more additional HTS tape layers within the helical channel of the coil form so that each of the one or more additional HTS tape layers are positioned on top of an HTS tape layer already present within the helical channel.

12. The method of claim 11, wherein the coil form is a first coil form and, after rotating the rotatable spool to position a plurality of HTS tape layers within the helical channel of the first coil form, the method further comprising:
positioning a second coil form onto the rotatable spool of the winding machine and in concentric relation to the first coil form, the second coil form comprising a helical channel formed on an exterior surface of the second coil form and the helical channel extending at least partially along an axial length of the second coil form;

rotating the rotatable spool to position the plurality of HTS tape layers within the helical channel of the second coil form; and positioning the HTS tape layers of the second coil form coincident with the HTS tape layers of the first coil form.

13. The method of claim 12, wherein the second coil form and the first coil form are separated from each other by an insulative gap.

14. The method of claim 11, wherein the HTS tape is a rare earth barium copper oxide (REBCO) HTS tape.

15. The method of claim 11, further comprising applying one or more reinforcement strips to the HTS tape layers.

16. The method of claim 11, wherein a depth of the helical channel of the coil form is reduced as the helical channel approaches an end portion of the coil form.

17. The method of claim 11, wherein the plurality of payoff spools are tensioned.

18. A high temperature superconductor (HTS) cable comprising:
a plurality of coil forms, each comprising copper and/or stainless steel and having an axial length and an exterior surface, wherein the exterior surface comprises a helical channel extending along at least part of the axial length;

a plurality of layers of REBCO HTS tape disposed within the helical channel; and a lead termination positioned at an end of one of the REBCO HTS tape layers, wherein the coil forms are positioned in concentric overlapping relation to one another other and separated from each other by an insulative gap, and wherein the plurality of layers of REBCO HTS tape comprise a first REBCO HTS tape layer wound within the helical channel of the coil form and one or more additional REBCO HTS tape layers wound within the helical channel of the coil form, each of the one or more additional REBCO HTS tape layers positioned on top of a REBCO HTS tape layer already present within the helical channel to form a stack of REBCO HTS tape layers.

* * * * *